United States Patent
Suzuki et al.

(10) Patent No.: US 11,987,493 B2
(45) Date of Patent: May 21, 2024

(54) DAMASCENE INTERCONNECT STRUCTURE, ACTUATOR DEVICE, AND METHOD OF MANUFACTURING DAMASCENE INTERCONNECT STRUCTURE

(71) Applicant: HAMAMATSU PHOTONICS K.K., Hamamatsu (JP)

(72) Inventors: Daiki Suzuki, Hamamatsu (JP); Nao Inoue, Hamamatsu (JP); Katsumi Shibayama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 498 days.

(21) Appl. No.: 17/288,250

(22) PCT Filed: Oct. 30, 2019

(86) PCT No.: PCT/JP2019/042669
§ 371 (c)(1),
(2) Date: Apr. 23, 2021

(87) PCT Pub. No.: WO2020/090931
PCT Pub. Date: May 7, 2020

(65) Prior Publication Data
US 2021/0387852 A1  Dec. 16, 2021

(30) Foreign Application Priority Data
Oct. 31, 2018  (JP) .................................. 2018-205351

(51) Int. Cl.
*G02B 26/08*  (2006.01)
*B81B 3/00*  (2006.01)
*B81C 1/00*  (2006.01)

(52) U.S. Cl.
CPC ........ *B81B 3/0072* (2013.01); *B81C 1/00666* (2013.01); *G02B 26/0833* (2013.01);
(Continued)

(58) Field of Classification Search
CPC ......... H01L 21/76831; H01L 21/76832; H01L 21/76834; H01L 21/76843; H01L 23/5227;
(Continued)

(56) References Cited

U.S. PATENT DOCUMENTS 6,909,188 B2 *  6/2005  Akiyama ................ H01L 24/05
257/784
7,067,874 B2  6/2006  Nakamura et al.
(Continued)

FOREIGN PATENT DOCUMENTS

CN  108474938 A  8/2018
EP  2944998 A1  11/2015
(Continued)

OTHER PUBLICATIONS

International Preliminary Report on Patentability dated May 14, 2021 for PCT/JP2019/042669.
(Continued)

*Primary Examiner* — Bilkis Jahan
(74) *Attorney, Agent, or Firm* — Faegre Drinker Biddle & Reath LLP

(57) ABSTRACT

The damascene wiring structure includes a base including a main surface provided with a groove, an insulating layer including a first portion provided on an inner surface of the groove and a second portion provided on the main surface, a metal layer provided on the first portion, a wiring portion embedded in the groove, and a cap layer provided to cover the second portion, an end portion of the metal layer, and the wiring portion. A surface of a boundary part between the first (Continued)

portion and the second portion includes an inclined surface inclined with respect to a direction perpendicular to the main surface. The end portion of the metal layer enters between the cap layer and the inclined surface, and in the end portion, a first surface along the cap layer and a second surface along the inclined surface form an acute angle.

19 Claims, 10 Drawing Sheets

(52) U.S. Cl.
CPC ..... *B81B 2201/042* (2013.01); *B81B 2207/07* (2013.01); *B81C 2201/0104* (2013.01); *B81C 2201/0181* (2013.01)

(58) Field of Classification Search
CPC .. H01L 23/535; G02B 26/101; G02B 26/0841
See application file for complete search history.

(56) References Cited

U.S. PATENT DOCUMENTS

| | | | |
|---|---|---|---|
| 2001/0013617 A1* | 8/2001 | Toyoda | H01L 21/76873 257/E21.585 |
| 2004/0113238 A1* | 6/2004 | Hasunuma | H01L 23/5329 257/E23.152 |
| 2005/0037608 A1 | 2/2005 | Andricacos et al. | |
| 2007/0190692 A1 | 8/2007 | Erturk et al. | |
| 2007/0281474 A1 | 12/2007 | Suzuki et al. | |
| 2008/0023846 A1 | 1/2008 | Seki et al. | |
| 2008/0128907 A1* | 6/2008 | Yang | H01L 21/76805 257/E23.141 |
| 2012/0306007 A1 | 12/2012 | Yanagisawa | |
| 2013/0181330 A1 | 7/2013 | Ramachandran et al. | |
| 2014/0087562 A1 | 3/2014 | Ikarashi | |
| 2016/0105090 A1* | 4/2016 | Sadaharu | G02B 26/101 310/38 |
| 2018/0076141 A1* | 3/2018 | Wu | H01L 21/76816 |
| 2018/0261501 A1* | 9/2018 | Tseng | H01L 21/76832 |
| 2023/0181330 A1 | 6/2023 | Predick | |

FOREIGN PATENT DOCUMENTS

| | | |
|---|---|---|
| JP | H06-084896 A | 3/1994 |
| JP | 2007-200980 A | 8/2007 |
| JP | 2008-034508 A | 2/2008 |
| JP | 2009-524220 A | 6/2009 |
| JP | 2012-212797 A | 11/2012 |
| JP | 2013-504891 A | 2/2013 |
| JP | 2013-077631 A | 4/2013 |
| JP | 2013-206991 A | 10/2013 |
| JP | 2014-013821 A | 1/2014 |
| JP | 2014-063866 A | 4/2014 |
| JP | 2015-534261 A | 11/2015 |
| JP | 2017-092238 A | 5/2017 |
| JP | 2017-120851 A | 7/2017 |
| JP | 2018-093038 A | 6/2018 |
| WO | WO-2007/084879 A2 | 7/2007 |
| WO | WO-2011/033496 A1 | 3/2011 |
| WO | WO-2014/035820 A1 | 3/2014 |
| WO | WO-2017/150628 A1 | 9/2017 |
| WO | WO-2018/159077 A1 | 9/2018 |

OTHER PUBLICATIONS

International Preliminary Report on Patentability dated May 14, 2021 for PCT/JP2019/042668.

Nilsson D. et al., "Fabrication of silicon molds for polymer optics", Journal of Micromechanics and Microengineering, Institute of Physics Publishing, Bristol, GB, vol. 13, No. 4, Jul. 1, 2003, p. 57-p. 61, XP020068938.

Thomas Defforge et al., "Scalloping removal on DRIE via using low concentrated alkaline solutions at low temperature", Sensors and Actuators A: Physical, Elsevier BV, NL, vol. 170, No. 1, May 29, 2011, p. 114-p. 120, XP028273445.

* cited by examiner

Fig.5
(a)
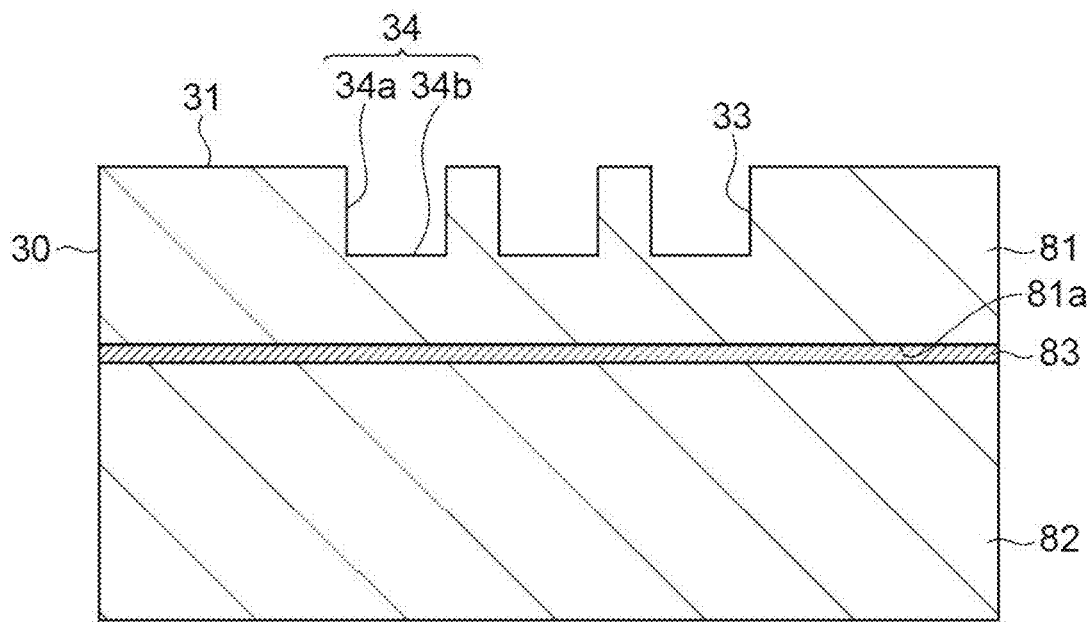
(b)
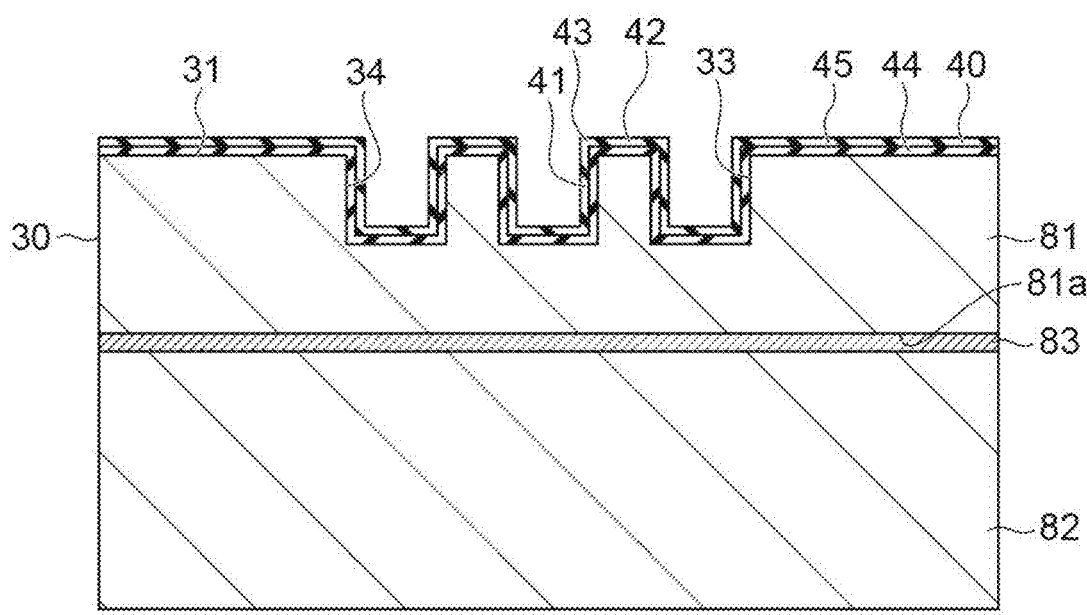

Fig.6
(a)
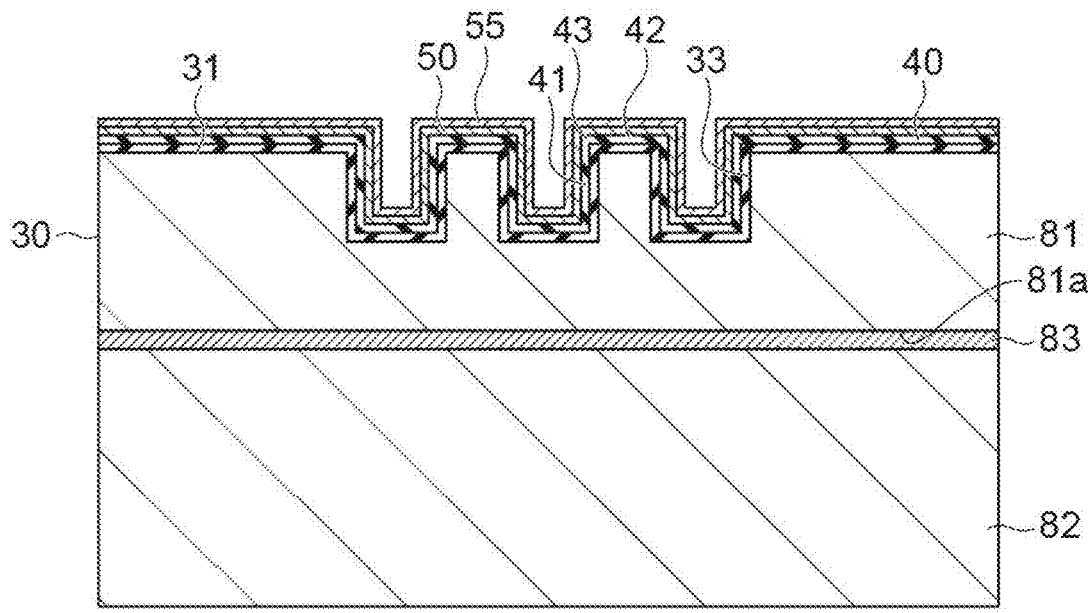
(b)
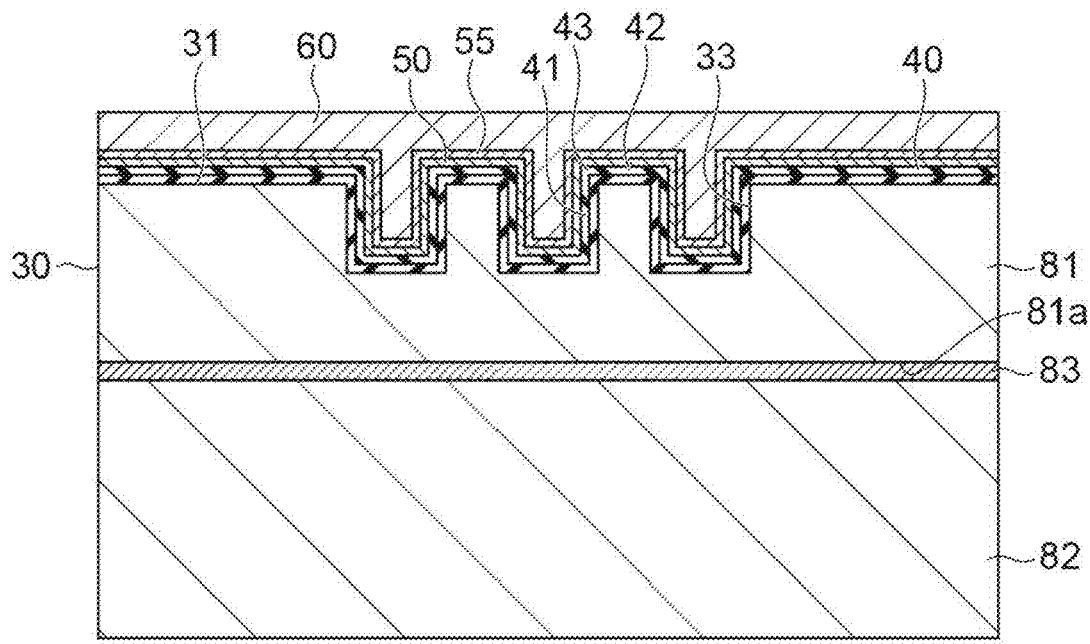

Fig.7
(a)
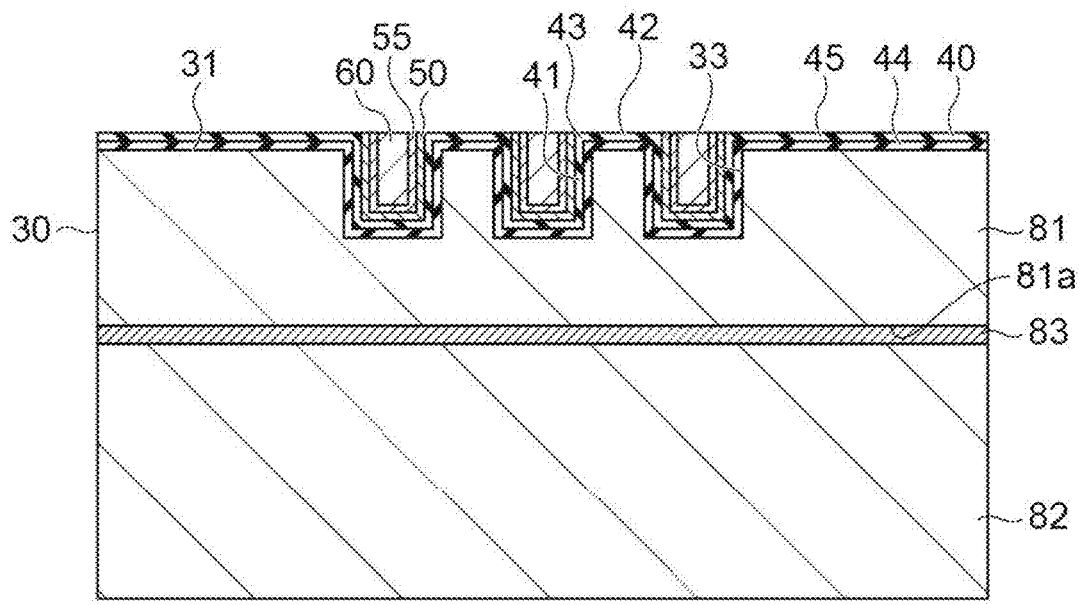
(b)
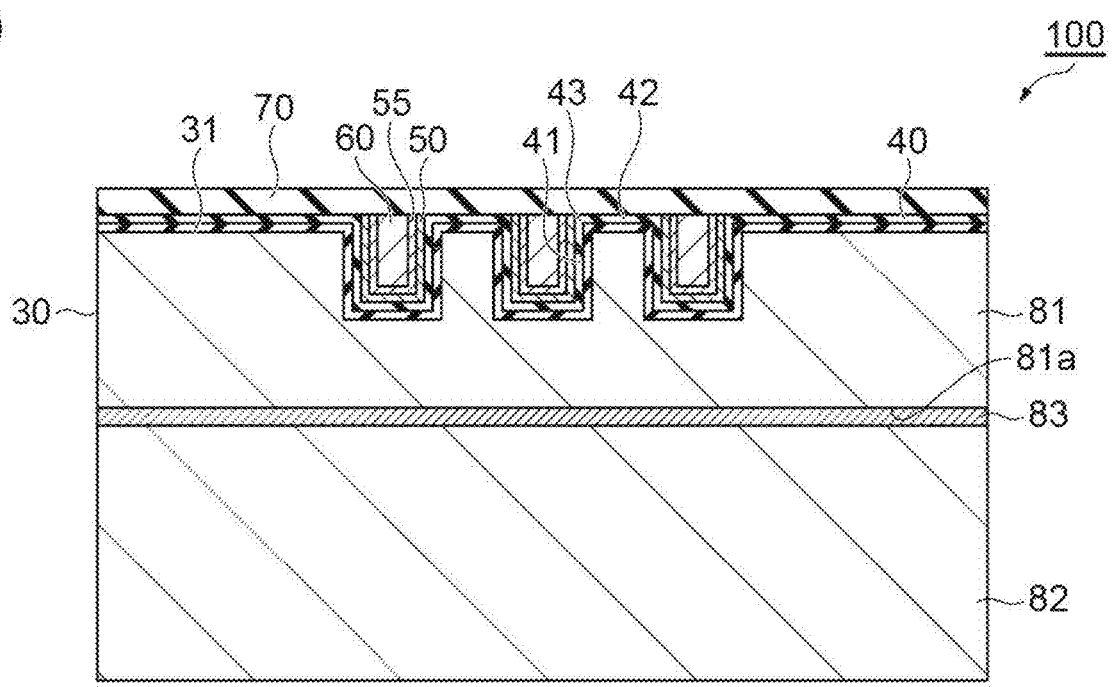

Fig.10
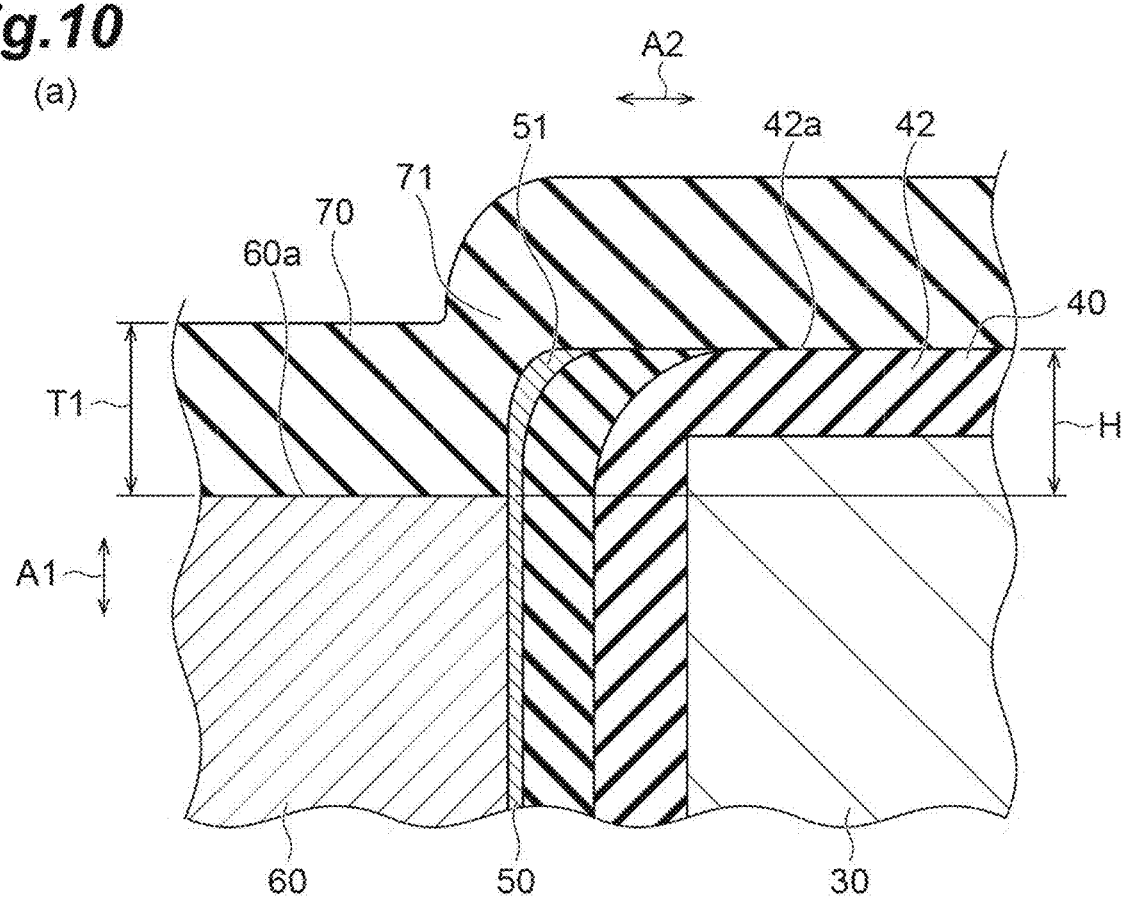
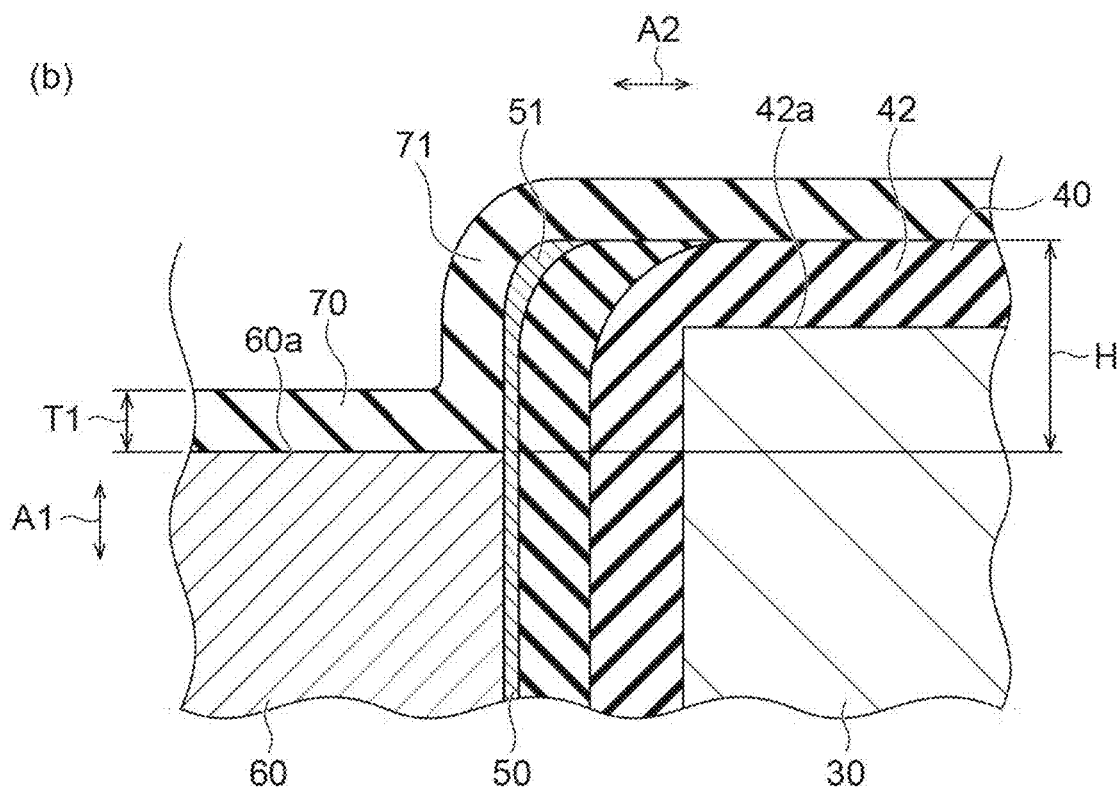

DAMASCENE INTERCONNECT STRUCTURE, ACTUATOR DEVICE, AND METHOD OF MANUFACTURING DAMASCENE INTERCONNECT STRUCTURE

TECHNICAL FIELD

One aspect of the present disclosure relates to a damascene wiring structure, an actuator device, and a method of manufacturing the damascene wiring structure.

BACKGROUND ART

Conventionally, a damascene wiring structure in which a wiring portion is formed by embedding a metal material in a groove is known (for example, see Patent Literature 1). In such a damascene wiring structure, a metal layer is provided on the inner surface of the groove portion, and the wiring portion is joined to the metal layer.

CITATION LIST

Patent Literature

Patent Literature 1: Japanese Unexamined Patent Publication No. H6-84896

SUMMARY OF INVENTION

Technical Problem

In the damascene wiring structure as described above, stress may act on the wiring portion and the metal layer. For example, when a damascene wiring structure is applied to a coil of an actuator device using a Lorentz force acting on the coil by interaction with a magnetic field, stress in a direction perpendicular to the extending direction of the wiring portion acts on the wiring portion and the metal layer. On the other hand, in the damascene wiring structure as described above, a cap layer may be provided so as to cover the surface of the wiring portion and the end portion of the metal layer. In such a damascene wiring structure, when a stress acts on the wiring portion and the metal layer, the stress is concentrated on a portion of the cap layer which is in contact with the wiring portion and the metal layer, and there is a concern that peeling or damage may occur in the portion.

Therefore, it is an object of an aspect of the present disclosure to provide a highly reliable damascene wiring structure and actuator device, and a method of manufacturing a damascene wiring structure capable of obtaining such a damascene wiring structure.

Solution to Problem

A damascene wiring structure according to an aspect of the present disclosure includes: a base including a main surface provided with a groove; an insulating layer including a first portion provided on an inner surface of the groove and a second portion provided on the main surface and formed integrally with the first portion; a metal layer provided on the first portion of the insulating layer; a wiring portion embedded in the groove and joined to the metal layer; and a cap layer provided to cover the second portion of the insulating layer, an end portion of the metal layer, and the wiring portion. A surface of a boundary part between the first portion and the second portion in the insulating layer on a side opposite to the base includes an inclined surface inclined with respect to a direction perpendicular to the main surface when viewed from an extending direction of the wiring portion. The end portion of the metal layer enters between the cap layer and the inclined surface, and in the end portion, a first surface along the cap layer and a second surface along the inclined surface form an acute angle.

In this damascene wiring structure, the insulating layer includes a first portion provided on the inner surface of the groove and a second portion formed integrally with the first portion and provided on the main surface, and the cap layer is provided so as to cover the second portion of the insulating layer, the end portion of the metal layer, and the wiring portion. Accordingly, for example, compared to a case where the insulating layer includes only the first portion, it is possible to reduce the number of places on which stress is likely to concentrate. Further, the surface of the boundary part between the first portion and the second portion in the insulating layer on the side opposite to the base includes an inclined surface, and the end portion of the metal layer enters between the cap layer and the inclined surface. In the end portion, the first surface along the cap layer and the second surface along the inclined surface form an acute angle. Accordingly, it is possible to suppress the stress from intensively acting on the cap layer. As described above, the reliability of the damascene wiring structure is improved.

The thickness of the cap layer may be greater than a thickness of the insulating layer. In this case, the strength of the cap layer can be increased, and the reliability can be further increased.

A portion of the cap layer in contact with the first surface of the end portion of the metal layer and a portion of the insulating layer in contact with the second surface of the end portion of the metal layer may be made of the same material. In this case, the joining strength between the cap layer and the insulating layer can be increased in the vicinity of the contact portion between the cap layer and the end portion of the metal layer, and the reliability can be further increased.

The insulating layer may include a first layer made of an oxide film and a second layer made of a nitride film and provided on the first layer. In this case, since the inclined shape can be easily formed in the first layer made of the oxide film, the inclined surface can be easily formed.

A boundary surface inclined with respect to a direction perpendicular to the main surface may be provided at a boundary part between the main surface and the groove in the base when viewed from the extending direction. In this case, the formation of the inclined surface can be further facilitated.

The inclined surface may be convexly curved. In this case, it is possible to more reliably prevent stress from intensively acting on the cap layer.

A third surface opposite to the second surface in the end portion of the metal layer may be inclined with respect to a direction perpendicular to the main surface when viewed from the extending direction, and a part of the wiring portion may enter between the cap layer and the third surface. In this case, the end portion of the metal layer can be suppressed by the wiring portion, and the stress acting on the cap layer from the metal layer can be reduced. Further, since the thickness of the part of the wiring portion in the direction perpendicular to the main surface is reduced, stress acting on the cap layer from the wiring portion can be reduced.

The thickness of the end portion of the metal layer in the direction parallel to the main surface may be larger than the thickness of a portion of the metal layer other than the end portion. In this case, the contact area between the end portion of the metal layer and the cap layer can be increased, and the stress acting on the cap layer from the metal layer can be more suitably dispersed.

The thickness of the end portion of the metal layer in the direction parallel to the main surface may gradually increase toward the tip of the end portion. In this case, the contact area between the end portion of the metal layer and the cap layer can be further increased, and the stress acting on the cap layer from the metal layer can be further suitably dispersed.

The first contact surface of the wiring portion in contact with the cap layer may be located on the bottom side of the groove with respect to the second contact surface of the insulating layer in contact with the cap layer. In this case, it is possible to further reduce the number of portions on which stress is likely to concentrate. Further, the contact area between the end portion of the metal layer and the cap layer can be further increased, and the stress acting on the cap layer from the metal layer can be further suitably dispersed.

The thickness of the cap layer may be larger than a distance between the first contact surface and the second contact surface in a direction perpendicular to the main surface. In this case, the strength of the cap layer can be further increased.

A thickness of the cap layer may be smaller than a distance between the first contact surface and the second contact surface in a direction perpendicular to the main surface. In this case, the stress acting on the cap layer from the wiring portion can be further reduced.

The groove may extend in a spiral shape when viewed from a direction perpendicular to the main surface. Even in such a case, high reliability can be obtained.

An interval between adjacent portions of the groove may be smaller than the width of the groove. In this case, the pitch (interval) of the wirings can be narrowed, and space saving can be achieved.

The width of the groove may be smaller than the depth of the groove. In this case, space can be saved and the resistance of the wiring can be reduced.

The base may include an opposite surface opposite to the main surface, and a distance between a bottom portion of the groove and the opposite surface in a direction perpendicular to the main surface may be larger than the depth of the groove. In this case, the strength of the base can be increased, and the reliability can be further increased.

An actuator device according to an aspect of the present disclosure is an actuator device including the above-described damascene wiring structure, the actuator including an support, a movable portion swingably supported at the support, a coil including the damascene wiring structure and provided in at least one of the support and the movable portion, and a magnetic field generation unit that generates a magnetic field acting on the coil. In this actuator device, stress in a direction perpendicular to the extending direction of the wiring portion acts on the wiring portion and the metal layer, but for the reasons described above, reliability can be increased.

A method of manufacturing a damascene wiring structure according to an aspect of the present disclosure includes: a first step of forming an insulating layer on a base including a main surface provided with a groove, the insulating layer including a first portion provided on an inner surface of the groove and a second portion formed integrally with the first portion and provided on the main surface; a second step of forming a metal layer on the first portion and the second portion of the insulating layer after the first step; a third step of forming a wiring portion on the metal layer so as to be embedded in the groove and joined to the metal layer after the second step; a fourth step of removing and planarizing the metal layer and the wiring portion on the second portion by chemical mechanical polishing so that the second portion of the insulating layer is exposed after the third step; and a fifth step of forming a cap layer so as to cover the second portion of the insulating layer, an end portion of the metal layer, and the wiring portion after the fourth step. In the first step, the insulating layer is formed such that a surface of a boundary part between the first portion and the second portion in the insulating layer on a side opposite to the base includes an inclined surface inclined with respect to a direction perpendicular to the main surface when viewed from an extending direction of the wiring portion. According to this method of manufacturing a damascene wiring structure, a highly reliable damascene wiring structure as described above can be obtained.

In the second step, the metal layer may be formed by sputtering. In this case, the thickness of the end portion of the metal layer in the direction parallel to the main surface can be gradually increased toward the tip of the end portion, and the contact area between the end portion of the metal layer and the cap layer can be increased.

Advantageous Effects of Invention

According to an aspect of the present disclosure, it is possible to provide a highly reliable damascene wiring structure and actuator device, and a method of manufacturing a damascene wiring structure capable of obtaining such a damascene wiring structure.

BRIEF DESCRIPTION OF DRAWINGS

FIG. 5(a) and FIG. 5(b) are cross-sectional views for explaining a method of manufacturing a damascene wiring structure.

FIG. 6(a) and FIG. 6(b) are cross-sectional views for explaining a method of manufacturing a damascene wiring structure.

FIG. 7(a) and FIG. 7(b) are cross-sectional views for explaining a method of manufacturing a damascene wiring structure.

FIG. 10(a) is a cross-sectional view of a damascene wiring structure according to a third modification, and FIG. 10(b) is a cross-sectional view of the damascene wiring structure according to the fourth modification.

DESCRIPTION OF EMBODIMENTS

Figure 1:
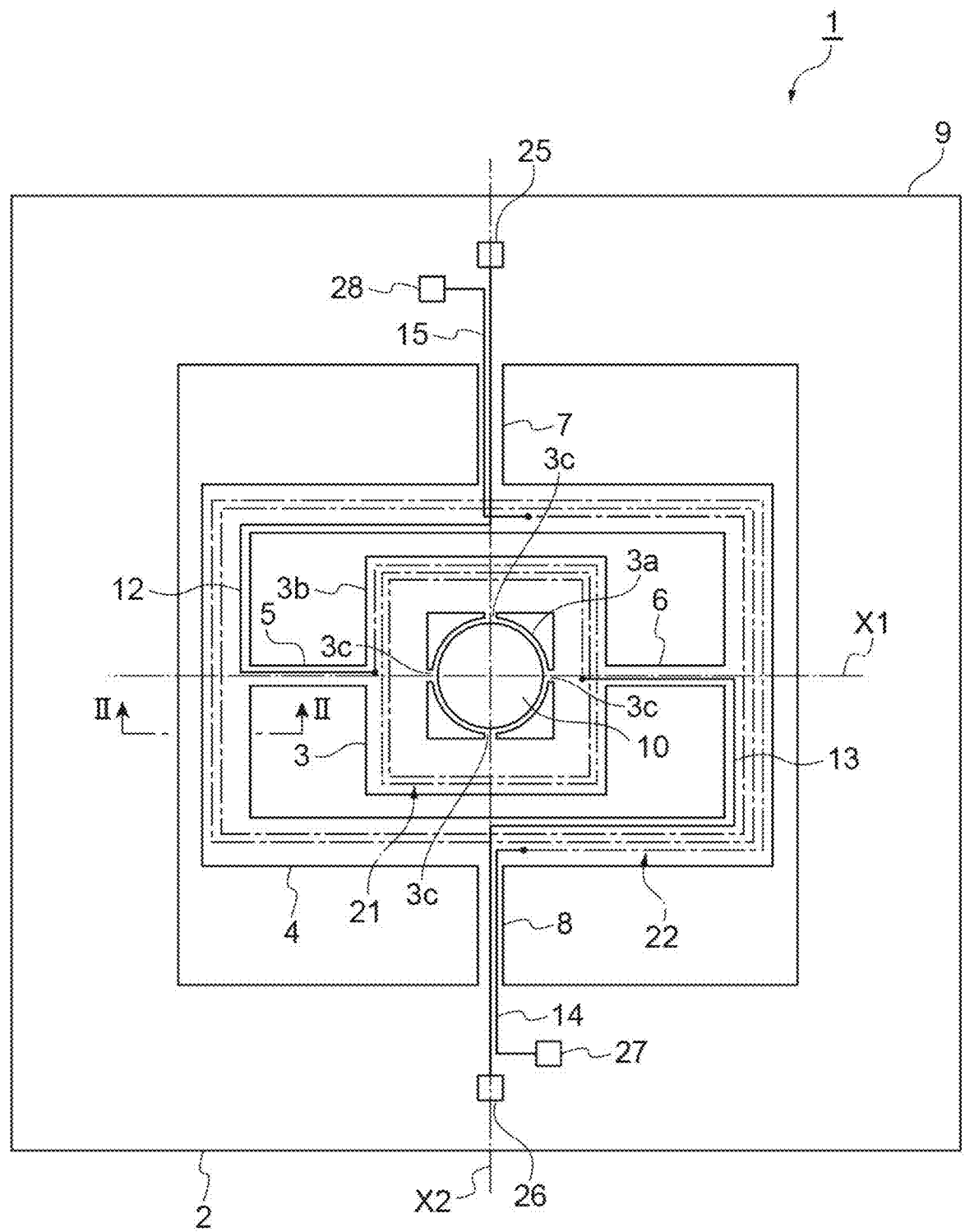
FIG. 1 is a plan view of the actuator device according to the embodiment.

Hereinafter, an embodiment of the present disclosure will be described in detail with reference to the drawings. In the following description, the same reference numerals are used for the same or corresponding element, and redundant description is omitted.

[Configuration of Mirror Device]

As shown in FIG. 1, the mirror device (actuator device) 1 includes a support 2, a first movable portion 3, a second movable portion (support) 4, a pair of first connection portions 5 and 6, a pair of second connection portions 7 and 8, and a magnetic field generation unit 9. The support 2, the first movable portion 3, the second movable portion 4, the first connection portions 5 and 6, and the second connection portions 7 and 8 are integrally formed by a semiconductor substrate such as a silicon on insulator (SOI) substrate. That is, the mirror device 1 is configured as a micro electro mechanical systems (MEMS) device.

In the mirror device 1, a first movable portion 3 including a mirror surface (optical surface) 10 is swung around a first axis X1 and a second axis X2 orthogonal to each other. The mirror device 1 can be used in, for example, an optical switch for optical communication, an optical scanner, or the like. The magnetic field generation unit 9 is configured by, for example, a permanent magnet arranged in a Halbach array or the like. The magnetic field generation unit 9 generates a magnetic field that acts on coils 21 and 22 described later.

The support 2 has, for example, a rectangular outer shape in plan view, and is formed in a frame shape. The support 2 is disposed on one side of the magnetic field generation unit 9 in a direction perpendicular to the mirror surface 10. The first movable portion 3 is disposed inside the support 2 in a state of being separated from the magnetic field generation unit 9. The "plan view" means a view from a direction perpendicular to the mirror surface 10, in other words, a view from a direction perpendicular to a main surface 31 of the substrate 30 described later.

The first movable portion 3 includes an arrangement portion 3a, a frame portion 3b surrounding the arrangement portion 3a, and a plurality of (four in this example) connection portions 3c connecting the arrangement portion 3a and the frame portion 3b to each other. The arrangement portion 3a is formed in, for example, a circular shape in plan view. For example, the mirror surface 10 of a circular shape is provided on the surface of the arrangement portion 3a opposite to the magnetic field generation unit 9. The mirror surface 10 is formed of a reflective film made of, for example, aluminum, an aluminum-based alloy, silver, a silver-based alloy, gold, or a dielectric multilayer film or the like.

The frame portion 3b has, for example, a rectangular outer shape in plan view and is formed in a frame shape. The plurality of connection portions 3c are arranged on both sides of the arrangement portion 3a on the first axis X1 and on both sides of the arrangement portion 3a on the second axis X2, and connect the arrangement portion 3a and the frame portion 3b to each other on the first axis X1 or the second axis X2.

The second movable portion 4 has, for example, a quadrangular outer shape in plan view and is formed in a frame shape. The second movable portion 4 is disposed inside the support 2 so as to surround the first movable portion 3 in a state of being separated from the magnetic field generation unit 9.

The first connection portions 5 and 6 are disposed on both sides of the first movable portion 3 on the first axis X1. Each of the first connection portions 5 and 6 connects the first movable portion 3 and the second movable portion 4 to each other on the first axis X1 so that the first movable portion 3 is swingable around the first axis X1. Each first connection portion 5 and 6 extends linearly along the first axis X1, for example.

The second connection portions 7 and 8 are disposed on both sides of the second movable portion 4 on the first axis X1. Each of the second connection portions 7 and 8 connects the second movable portion 4 and the support 2 to each other on the second axis line X2 so that the second movable portion 4 is swingable around the second axis line X2. Each of the second connection portions 7 and 8 extends linearly along the second axis X2, for example.

The mirror device 1 further includes coils 21 and 22, a plurality of wires 12, 13, 14, and 15, and a plurality of electrode pads 25, 26, 27, and 28. For example, the coil 21 is embedded in the frame portion 3b of the first movable portion 3 and extends in a spiral shape in plan view. For example, the coil 22 is embedded in the second movable portion 4 and extends in a spiral shape in plan view. Each coil 21 and 22 is made of a metal material such as copper.

The plurality of electrode pads 25, 26, 27, and 28 are provided on the support 2. The wiring 12 electrically connects one end of the coil 21 and the electrode pad 25. The wiring 12 extends from one end of the coil 21 to the electrode pad 25 via the first connection portion 5, the second movable portion 4, and the second connection portion 7. The wiring 13 electrically connects the other end of the coil 21 and the electrode pad 26. The wiring 13 extends from the other end of the coil 21 to the electrode pad 26 via the first connection portion 6, the second movable portion 4, and the second connection portion 8.

The wiring 14 electrically connects one end of the coil 22 and the electrode pad 27. The wiring 14 extends from one end of the coil 22 to the electrode pad 27 via the second connection portion 8. The wiring 15 electrically connects the other end of the coil 22 and the electrode pad 28. The wiring 15 extends from the other end of the coil 22 to the electrode pad 28 via the second connection portion 7.

In the mirror device 1 configured as described above, when a drive signal for linear operation is input to the coil 22 via the electrode pads 27 and 28 and the wirings 14 and 15, a Lorentz force acts on the coil 22 due to interaction with the magnetic field generated by the magnetic field generation unit 9. By using the balance between the Lorentz force and the elastic force of the second connection portions 7 and 8, the mirror surface 10 (the first movable portion 3) can be linearly moved together with the second movable portion 4 around the second axis X2.

On the other hand, when the drive signal of the resonance motion is input to the coil 21 via the electrode pads 25 and 26 and the wirings 12 and 13, the Lorentz force acts on the coil 21 by the interaction with the magnetic field generated by the magnetic field generation unit 9. In addition to the Lorentz force, by using the resonance of the first movable portion 3 at the resonance frequency, the mirror surface 10 (first movable portion 3) can be resonantly moved around the first axis X1.

[Damascene Wiring Structure]

Figure 2:
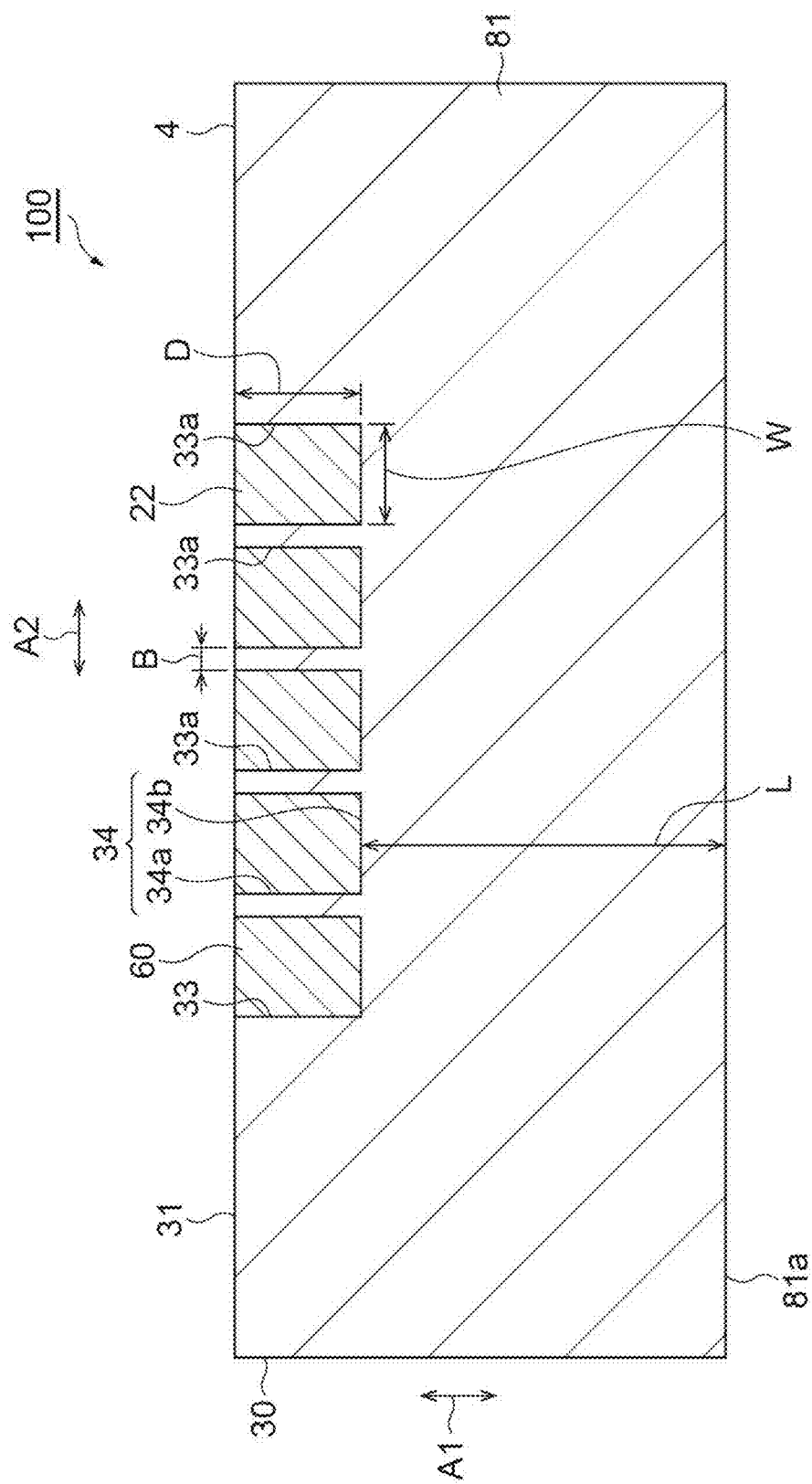
FIG. 2 is a cross-sectional view taken along line II-II of FIG. 1.
Figure 3:
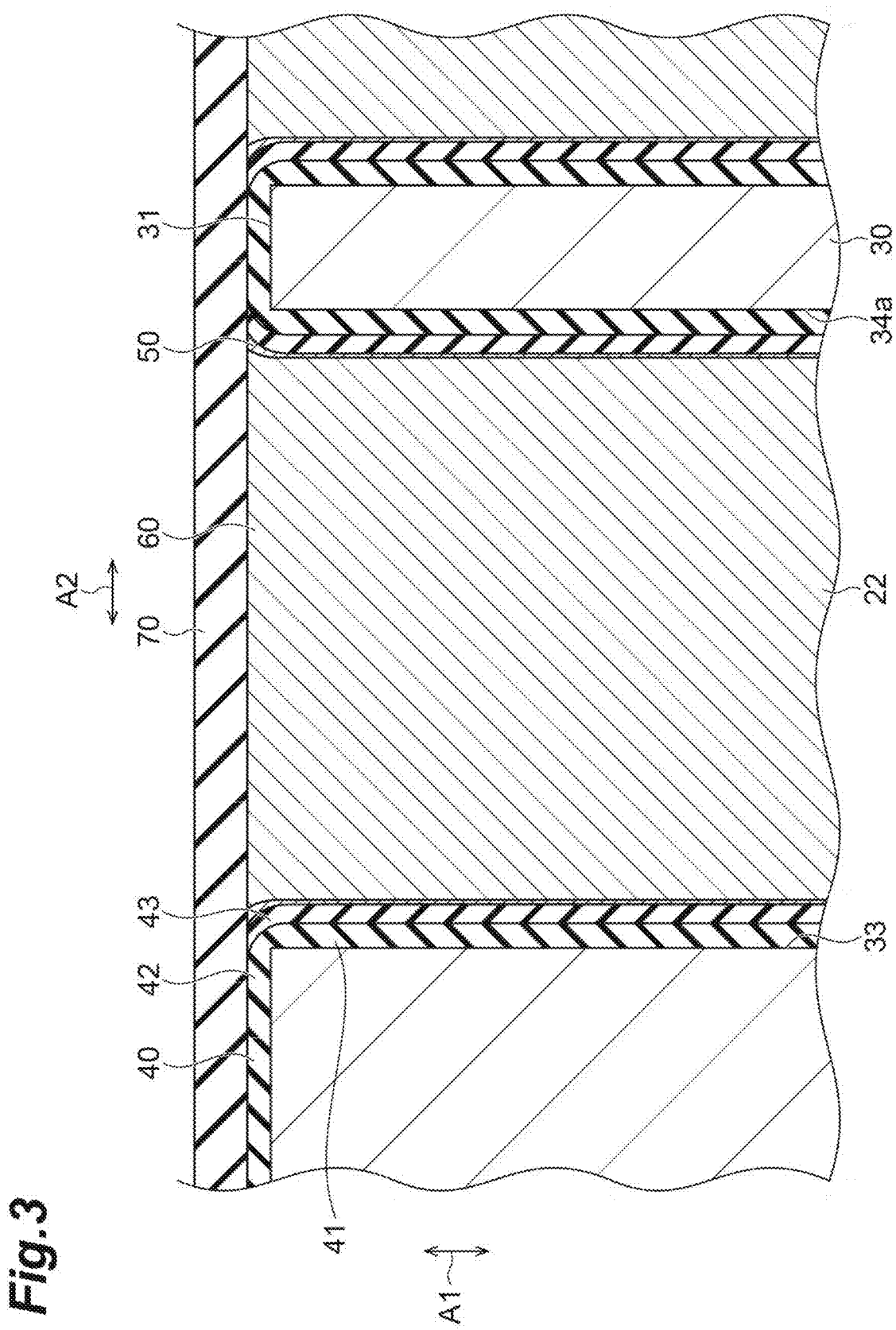
FIG. 3 is an enlarged view of FIG. 2.

The damascene wiring structure 100 of the coils 21 and 22 will be described with reference to FIGS. 2, 3, and 4. Since the coils 21 and 22 have the same configuration, the coil 22 will be described below, and the description of the coil 21 will be omitted.

As described above, the coil 22 is provided in the second movable portion 4. The second movable portion 4 is constituted by, for example, the first silicon layer 81 of the substrate (base) 30. The substrate 30 includes, for example, a first silicon layer 81, a second silicon layer 82, and an insulating layer 83 disposed between the first silicon layer 81 and the second silicon layer 82 (FIGS. 5 to 7). The support 2 is constituted by the first silicon layer 81, the second silicon layer 82, and the insulating layer 83. The first movable portion 3, the second movable portion 4, the first connection portions 5 and 6, and the second connection portions 7 and 8 are constituted by the first silicon layer 81. The substrate 30 has a main surface 31. In this example, the main surface 31 is a surface of the first silicon layer 81 opposite to the insulating layer 83.

The main surface 31 is provided with a groove 33. The groove 33 has a shape corresponding to the coil 21, and extends in a spiral shape in plan view in this example. In a cross section perpendicular to the extending direction of the groove 33, the groove 33 has, for example, a rectangular shape. In this example, the inner surface 34 of the groove 33 has a side surface 34a and a bottom surface (bottom portion) 34b. Although only one cross section is shown in FIGS. 2 to 4, for example, the damascene wiring structure 100 is uniformly configured in the extending direction of the groove 33, and is similarly configured in any cross section perpendicular to the extending direction of the groove 33. However, the damascene wiring structure 100 does not necessarily have to be configured uniformly with respect to the extending direction of the groove 33. For example, the damascene wiring structure 100 may have the shape of the present embodiment in a part of the extending direction of the groove 33, and may have the shape of modification examples described later in another part of the extending direction of the groove 33.

The damascene wiring structure 100 includes an insulating layer 40, a metal layer 50, a wiring portion 60, and a cap layer 70 in addition to a substrate 30 as a base. The insulating layer 40 is provided over the main surface 31 and the inner surface 34 of the groove 33. More specifically, the insulating layer 40 includes a first portion 41 provided on the inner surface 34 and a second portion 42 formed integrally with the first portion 41 and provided on the main surface 31. A boundary part 43 between the first portion 41 and the second portion 42 in the insulating layer 40 is located on a boundary part between the main surface 31 and the groove 33 in the substrate 30.

The insulating layer 40 includes a first layer 44 and a second layer 45. The first layer 44 is made of an oxide film and provided on the main surface 31 and the inner surface 34 of the groove 33. The oxide film constituting the first layer 44 is, for example, a silicon oxide film ($SiO_2$) formed by thermally oxidizing silicon. The second layer 45 is made of a nitride film and provided on the first layer 44. The nitride film constituting the second layer 45 is, for example, a silicon nitride film (SiN) or the like. The first portion 41 and the boundary part 43 are constituted by the first layer 44 and the second layer 45, and the second portion 42 is constituted by the first layer 44.

The metal layer 50 is provided over the first portion 41 of the insulating layer 40. That is, the metal layer 50 is provided on the inner surface 34 of the groove 33 via the first portion 41. The metal layer 50 is made of a metal material such as titanium (Ti). The metal layer 50 can function as, for example, a seed layer for stably forming the wiring portion 60 on the semiconductor substrate, and a barrier layer for preventing diffusion of metallic elements contained in the wiring portion 60 into the first silicon layer 81.

The wiring portion 60 is embedded in the groove 33 and joined to the metal layer 50. That is, the wiring portion 60 is provided in the groove 33 via the first portion 41 of the insulating layer 40 and the metal layer 50. The wiring portion 60 is made of, for example, a metal material such as copper (Cu). The shape of the metal layer 50 in a cross section perpendicular to the extending direction of the wiring portion 60 (in other words, the extending direction of the groove 33) corresponds to the cross-sectional shape of the groove 33, and in this example, has a substantially rectangular shape. As in the present embodiment, when the wiring portion 60 extends spirally in plan view and the wiring portion 60 includes a first portion extending in a direction parallel to the first axis X1 and a second portion extending in a direction parallel to the second axis X2, the extending direction of the wiring portion 60 is a direction parallel to the first axis X1 in the first portion and a direction parallel to the second axis X2 in the second portion. Alternatively, when the wiring portion 60 extends in a curved shape or having curves, the extending direction of a certain portion of the wiring portion 60 may be a tangential direction of the portion.

The cap layer 70 is provided so as to cover the second portion 42 of the insulating layer 40, the end portion 51 of the metal layer 50, and the wiring portion 60. In this example, the cap layer 70 extends in a planar shape parallel to the main surface 31. The thickness T1 of the cap layer 70 is larger than the thickness T2 of the insulating layer 40. The cap layer 70 is made of, for example, a silicon nitride film and has an insulating property. That is, the cap layer 70 is made of the same material as the second layer 45 of the insulating layer 40.

Figure 4:
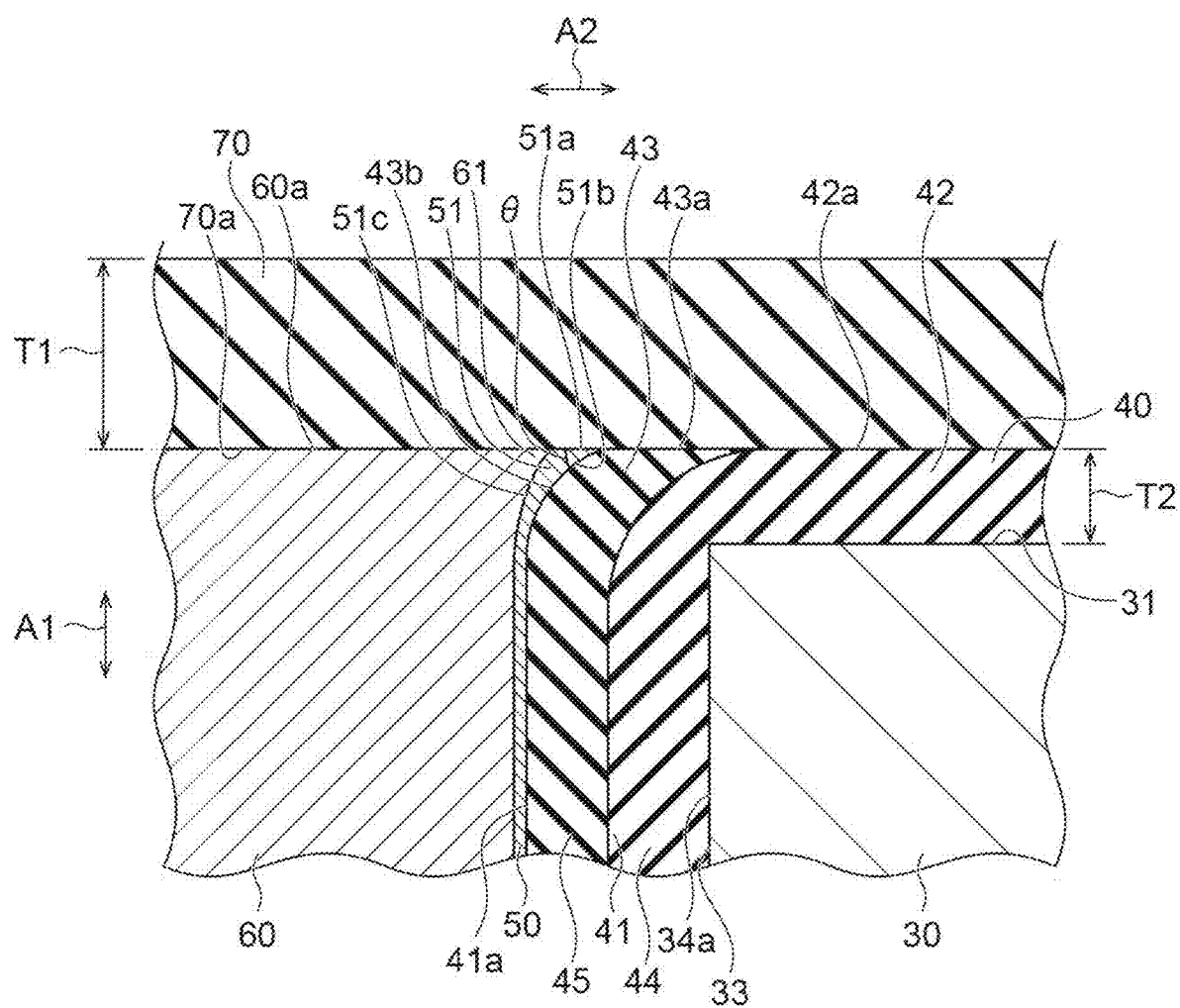
FIG. 4 is an enlarged view of FIG. 3.

As shown in FIG. 4, a surface 41a of the first portion 41 of the insulating layer 40 opposite to the substrate 30 is, for example, a flat surface perpendicular to the main surface 31. A surface 42a of the second portion 42 of the insulating layer 40 opposite to the substrate 30 is, for example, a flat surface parallel to the main surface 31. The surface 42a is in contact with the cap layer 70. A surface 43a of the boundary part 43 opposite to the substrate 30 includes an inclined surface 43b inclined with respect to the direction A1 perpendicular to the main surface 31 when viewed from the extending direction of the wiring portion 60. More specifically, the inclined surface 43b is inclined outward with respect to the surface 41a of the first portion 41 (so as to be away from the center of the groove 33 as the distance from the bottom surface 34b of the groove 33 increases). In this example, the inclined surface 43b is curved convexly toward the side opposite to the substrate 30.

The end portion 51 of the metal layer 50 enters between the cap layer 70 and the inclined surface 43b. More particularly, the end portion 51 has a portion disposed in a space formed between the cap layer 70 and the inclined surface 43b in the direction A1 perpendicular to the main surface 31.

The end portion 51 has a first surface 51a, a second surface 51b continuous with the first surface 51a, and a third surface 51c continuous with the first surface 51a on a side opposite to the second surface 51b. The first surface 51a extends along the cap layer 70 and is joined to the cap layer 70. In this example, the first surface 51a is a flat surface and is positioned on the same plane as the surface 42a of the second portion 42 of the insulating layer 40 and the surface 60a of the wiring portion 60 described later.

The second surface 51b extends along the inclined surface 43b and is joined to the inclined surface 43b. Similarly to the inclined surface 43b, the second surface 51b is inclined outward with respect to the direction A1 perpendicular to the main surface 31. The second surface 51b is concavely curved toward the side opposite to the substrate 30. The second surface 51b is in contact with the second layer 45 constituting the boundary part 43 of the insulating layer 40. That is, a portion of the insulating layer 40 in contact with the second surface 51b (in this example, the second layer 45 constituting the boundary part 43) is made of the same material (silicon nitride film) as a portion of the cap layer 70 in contact with the first surface 51a. As described above, in this example, the entire cap layer 70 is formed of a silicon nitride film. This can increase the joining strength between the insulating layer 40 and the cap layer 70.

The third surface 51c is a surface opposite to the second surface 51b in the end portion 51. The third surface 51c is inclined outward with respect to the direction A1 when viewed from the extending direction of the wiring portion 60. The degree of inclination of the third surface 51c with respect to the direction A1 is gentler than the degree of inclination of the second surface 51b with respect to the direction A1. Accordingly, the thickness of the end portion 51 in the direction A2 parallel to the main surface 31 gradually increases toward the tip of the end portion 51. A part 61 of the wiring portion 60 located at a boundary part between the metal layer 50 and the cap layer 70 enters between the cap layer 70 and the third surface 51c. To be more specific, the part 61 of the wiring portion 60 is disposed in a space formed between the cap layer 70 and the first surface 51c in the direction A1.

In the end portion 51, the first surface 51a and the second surface 51b form an acute angle. In other words, the angle θ formed by the first surface 51a and the second surface 51b is smaller than 90 degrees. That is, the thickness of the end portion 51 in the direction A1 perpendicular to the main surface 31 gradually decreases toward the tip of the end portion 51 (for example, the vertex formed by the first surface 51a and the second surface 51b). The angle θ may be, for example, 15 degrees to 88 degrees. The end portion 51 of the metal layer 50 is not provided on the second portion 42 of the insulating layer 40.

The thickness (minimum thickness) of the end portion 51 in the direction A2 parallel to the main surface 31 is larger than the thickness of a portion of the metal layer 50 other than the end portion 51 (for example, a portion of the metal layer 50 located in the middle in the direction A1 perpendicular to the main surface 31 or a portion of the metal layer 50 located on the first portion 41 of the insulating layer 40). The thickness (maximum thickness) of the tip portion of the metal layer 50 in the direction A1 is smaller than the thickness T2 of the insulating layer 40. Here, the "tip portion of the metal layer 50" means a portion of the metal layer 50 in which the thickness in the direction A2 parallel to the main surface 31 is larger than the thickness in the direction A1 perpendicular to the main surface 31.

In this example, a surface (first contact surface) 60a of the wiring portion 60 that is in contact with the cap layer 70 is located on the same plane as the surface 42a of the second portion 42 of the insulating layer 40. The surface 42a is a surface (second contact surface) of the insulating layer 40 in contact with the cap layer 70. A surface 70a of the cap layer 70 on the substrate 30 side is a flat surface.

As described above, the groove 33 extends in a spiral shape in plan view. Thus, as shown in FIG. 2, the groove 33 has a plurality of portions 33a adjacent to each other. The distance B between the portions 33a is smaller than the width W of the groove 33. The width W of the groove 33 is smaller than the depth D of the groove 33. The depth D of the groove 33 is, for example, a distance between the main surface 31 and the bottom surface 34b in the direction A1 perpendicular to the main surface 31. The distance L between the bottom surface 33b of the groove 33 in the direction A1 perpendicular to the main surface 31 and the opposite surface of the substrate 30 opposite to the main surface 31 is larger than the depth D of the groove 34. In this example, the opposite surface is the surface 81a of the first silicon layer 81 on the insulating layer 83 side (opposite to the main surface 31).

[Functions and Effects]

In the damascene wiring structure 100, the insulating layer 40 includes the first portion 41 provided on the inner surface 34 of the groove 33 and the second portion 42 formed integrally with the first portion 41 and provided on the main surface 31, and the cap layer 70 is provided so as to cover the second portion 42 of the insulating layer 40, the end portion 51 of the metal layer 50, and the wiring portion 60. Accordingly, for example, compared to a case where the insulating layer 40 includes only the first portion 41, it is possible to reduce the number of portions on which stress is likely to concentrate. That is, when the insulating layer 40 includes only the first portion 41, the end portion of the insulating layer 40 is located in the vicinity of the boundary part between the main surface 31 and the groove 33, and the main surface 31 and the cap layer 70 are in contact with each other. In this case, the substrate 30, the end portion of the insulating layer 40, the end portion 51 of the metal layer 50, the wiring portion 60, and the cap layer 70 are in contact with each other at positions close to each other. Stress tends to concentrate on such a portion. On the other hand, in the damascene wiring structure 100, since the end portion of the insulating layer 40 is not present in the vicinity of the boundary part between the main surface 31 and the groove 33, it is possible to reduce the number of places where stress is concentrated. Further, the end portion 51 of the metal layer 50 extends so as to contact the cap layer 70. If the end portion 51 does not reach the cap layer 70 and remains at a position lower than the surface 60a of the wiring portion 60, a void may occur in a portion of the wiring portion 60 exposed from the metal layer 50. On the other hand, in the damascene wiring structure 100, the occurrence of such voids can be suppressed, and the peeling of the cap layer 70 or the like caused by the voids can be suppressed. Further, the surface 40a of the boundary part 43 between the first portion 41 and the second portion 42 opposite to the substrate 30 in the insulating layer 43 includes an inclined surface 43b, and the end portion 51 of the metal layer 50 enters between the cap layer 70 and the inclined surface 43b. In the end portion 51, the first surface 51a along the cap layer 70 and the second surface 51b along the inclined surface 43b form an acute angle. Accordingly, it is possible to suppress the stress from intensively acting on the cap layer 70. As described above, the reliability of the damascene wiring structure 100 is improved.

In the damascene wiring structure 100, the thickness T1 of the cap layer 70 is larger than the thickness T2 of the insulating layer 40. Accordingly, the strength of the cap layer 70 can be increased, and the reliability can be further increased.

In the damascene wiring structure 100, a portion of the cap layer 70 in contact with the first surface 51a of the end portion 51 and a portion of the insulating layer 40 in contact with the second surface 51b of the end portion 51 (the second layer 45 constituting the boundary part 43) are made of the same material. Accordingly, the joining strength between the cap layer 70 and the insulating layer 40 can be increased in the vicinity of the contact portion between the cap layer 70 and the end portion 51 of the metal layer 50, and the reliability can be further increased.

In the damascene wiring structure 100, the insulating layer 40 includes the first layer 44 made of an oxide film and the second layer 45 made of a nitride film and provided on the first layer 44. Accordingly, since the inclined shape can be easily formed in the first layer 44 made of the oxide film, the inclined surface 43b can be easily formed.

In the damascene wiring structure 100, the inclined surface 43b is convexly curved. Accordingly, it is possible to more reliably suppress the stress from intensively acting on the cap layer 70.

In the damascene wiring structure 100, the third surface 50c opposite to the second surface 51b in the end portion 51 of the metal layer 51 is inclined, and the part 61 of the wiring portion 60 enters between the cap layer 70 and the third surface 51c. Accordingly, the end portion 51 of the metal layer 50 can be suppressed by the wiring portion 60, and the stress acting on the cap layer 70 from the metal layer 50 can be reduced. Further, since the thickness of the part 61 of the wiring portion 60 in the direction A1 perpendicular to the main surface 31 is reduced, the stress acting on the cap layer 70 from the wiring portion 60 can be reduced.

In the damascene wiring structure 100, the thickness of the end portion 51 of the metal layer 50 in the direction A2 parallel to the main surface 31 is larger than the thickness of the portion of the metal layer 50 other than the end portion 51. Accordingly, the contact area between the end portion 51 of the metal layer 50 and the cap layer 70 can be increased, and the stress acting on the cap layer 70 from the metal layer 50 can be more suitably dispersed.

In the damascene wiring structure 100, the thickness of the end portion 51 of the metal layer 50 in the direction A2 parallel to the main surface 31 gradually increases toward the tip of the end portion 51. Accordingly, the contact area between the end portion 51 of the metal layer 50 and the cap layer 70 can be further increased, and the stress acting on the cap layer 70 from the metal layer 50 can be further suitably dispersed.

In the damascene wiring structure 100, the groove 33 extends in a spiral shape. Even when the groove 33 extends in a spiral shape as described above, high reliability can be obtained.

In the damascene wiring structure 100, the interval B between the portions 33a adjacent to each other in the groove 33 may be smaller than the width W of the groove 33. As a result, the pitch (interval) of the wirings can be narrowed, and space saving can be achieved.

In the damascene wiring structure 100, the width W of the groove 33 is smaller than the depth D of the groove 33. This makes it possible to save space and reduce the resistance of wiring.

In the damascene wiring structure 100, the distance L between the bottom surface 33b of the groove 33 in the direction A1 perpendicular to the main surface 31 and the opposite surface (the surface 81a of the first silicon layer 81) of the substrate 30 opposite to the main surface 31 is larger than the depth D of the groove 34. Accordingly, the strength of the substrate 30 can be increased, and the reliability can be further increased. [Method of Manufacturing Damascene Wiring Structure]

Next, a method of manufacturing the damascene wiring structure 100 will be described with reference to FIGS. 5 6, and 7. Note that in FIGS. 5 to 7, each part is schematically illustrated, but actually, each part is formed in a shape as illustrated in FIG. 4, for example.

First, as shown in FIG. 5(a), the substrate 30 including the first silicon layer 81, the second silicon layer 82, and the insulating layer 83 is prepared, and the groove 33 is formed on the main surface 31 of the substrate 30. The groove 33 is formed by, for example, reactive ion etching (DRIE) using the Bosch process. The thickness of the first silicon layer 81 is, for example, about 30 to 150 μm, and the thickness of the second silicon layer 82 is, for example, about 625 μm. The depth of the groove 33 is, for example, about 5 to 30 μm.

Subsequently, as shown in FIG. 5(b), the insulating layer 40 including the first portion 41 provided on the inner surface 34 and the second portion 42 formed integrally with the first portion 41 and provided on the main surface 31 is formed on the main surface 31 of the substrate 30 (first step). More specifically, after the first layer 44 made of a silicon oxide film (thermal oxide film) is formed over the main surface 31 and the inner surface 34 of the groove 33, the second layer 45 made of a silicon nitride film (LP-SiN) is formed on the first layer 44. The thickness of the first layer 44 and the second layer 45 is, for example, about 100 to 1000 nm.

To be more specific, in the first step, the insulating layer 40 is formed in which the substrate 43a of the boundary part 43 between the first portion 41 and the second portion 42 in the insulating layer 40 includes the inclined surface 43b inclined with respect to the direction A1 perpendicular to the main surface 31 when viewed from the extending direction of the wiring portion 60 (see FIG. 4). 30. For example, by forming the first layer 44 made of a silicon oxide film and the second layer 45 made of a silicon nitride film on the main surface 31 and the inner surface 34 of the groove 33, the inclined surface 43b is formed on the surface 43a of the boundary part 43. This is because the inclined shape is easily formed in the first layer 44 made of the silicon oxide film.

Subsequently, as shown in FIG. 6(a), the metal layer 50 is formed on the first portion 41 and the second portion 42 of the insulating layer 40 (second step). In the second step, the metal layer 55 is formed on the metal layer 50. The metal layer 55 is made of a metal material such as copper. The metal layer 55 functions as a seed layer together with the metal layer 50. The metal layers 50 and 55 are formed by, for example, sputtering, but may be formed by atom layer deposition (ALD), chemical vapor deposition (CVD), ion-plating, or electroless plating. The total thickness of the metal layer 50 and the metal layer 55 is, for example, about 10 nm to 3000 nm.

Subsequently, as shown in FIG. 6(b), the wiring portion 60 is formed so as to be embedded in the groove 33 and joined to the metal layer 50 (third step). The wiring portion 60 is formed by plating, for example. The wiring portion 60 is formed such that the average thickness of the wiring portion 60 on the main surface 31 is 1 μm or more, for example. In this example, since the metal layer 55 is made of the same material as that of the wiring portion 60, the wiring portion 60 and the metal layer 55 are integrated with each other when the wiring portion 60 is formed, and the interface between the wiring portion 60 and the metal layer 55 may be eliminated. In this case, the metal layer 55 can be regarded as constituting the wiring portion 60.

Subsequently, as shown in FIG. 7(a), the metal layer 50, the metal layer 55, and the wiring portion 60 on the second portion 42 are removed and planarized by chemical mechanical polishing (CMP) so that the second portion 42 of the insulating layer 40 is exposed (fourth step). In the fourth step, chemical mechanical polishing is performed on the insulating layer 40, the metal layer 50, the metal layer 55, and the wiring portion 60 from the side opposite to the substrate 30. A portion of each of the insulating layer 40, the metal layer 50, the metal layer 55, and the wiring portion 60 on the side opposite to the main surface 31 or the bottom surface 31b in the direction A1 perpendicular to the main surface 34 is removed, whereby the insulating layer 40, the metal layer 50, the metal layer 55, and the wiring portion 60 are planarized. At this time, in this example, a portion constituting the second portion 42 in the second layer 45 of the insulating layer 40 is removed.

Subsequently, as shown in FIG. 7(b), the cap layer 70 is formed so as to cover the second portion 42 of the insulating layer 40, the end portion 51 of the metal layer 50, and the wiring portion 60 (fifth step). The cap layer 70 is made of, for example, a silicon nitride film (PE-SiN) and is formed to a thickness of about 200 to 3000 nm. Subsequently, the second silicon layer 82 and the insulating layer 83 are removed by etching or the like. Through the above steps, the damascene wiring structure 100 described above is obtained.

[Modification]

Figure 8:
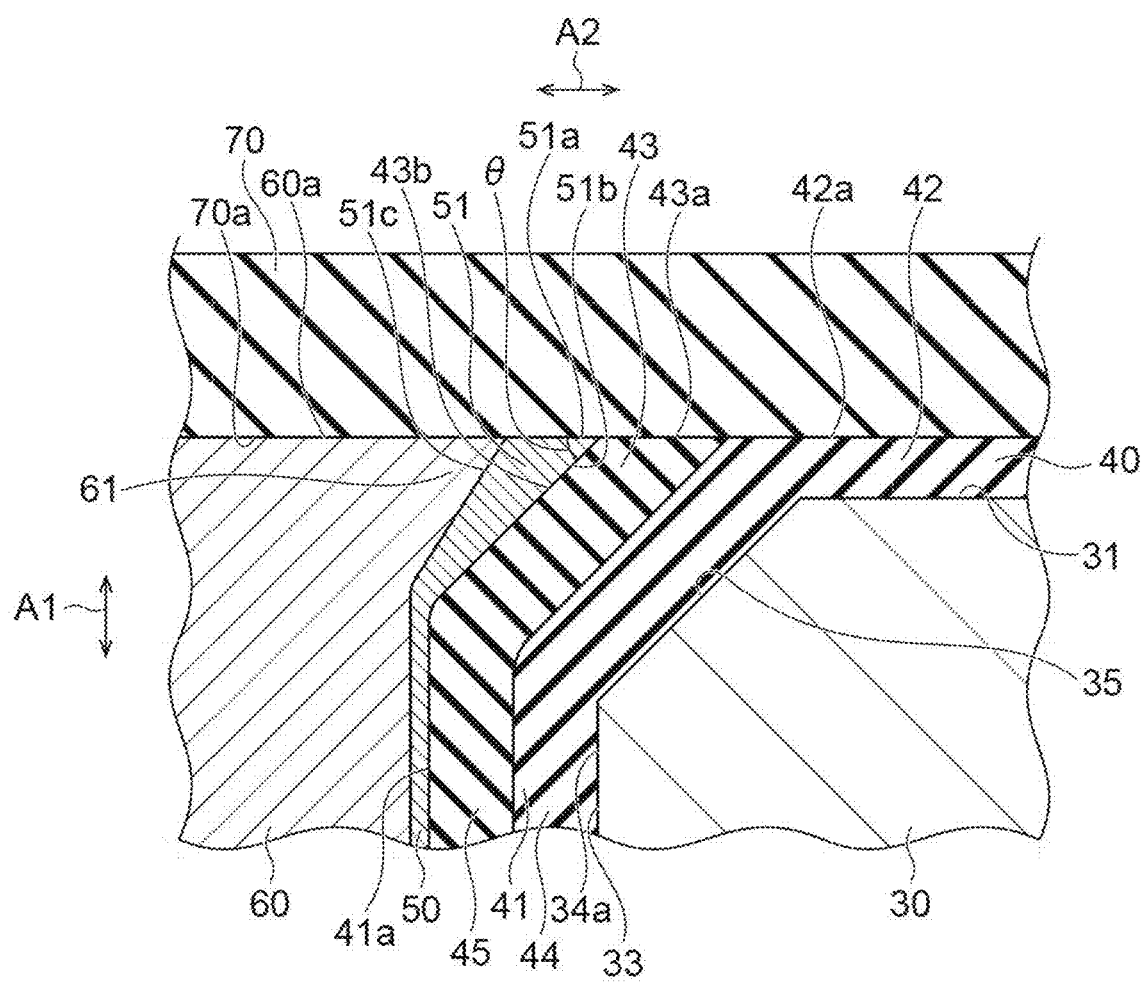
FIG. 8 is a cross-sectional view of a damascene wiring structure according to a first modification.

The present disclosure is not limited to the above embodiment. The damascene wiring structure 100 may be configured as in a first modification shown in FIG. 8. In the first modification, a boundary surface 35 inclined outward with respect to the direction A1 perpendicular to the main surface 31 when viewed from the extending direction of the wiring portion 60 is provided at a boundary part between the main surface 31 and the groove 33 in the substrate 30. The boundary surface 35 is, for example, a flat surface. Since the boundary part 43 of the insulating layer 40 is provided on the boundary surface 35, it extends along the boundary surface 35 and is inclined outward with respect to the direction A1 perpendicular to the main surface 31. The inclined surface 43b of the boundary part 43 and the second surface 51b of the end portion 51 of the metal layer 50 are flat surfaces parallel to the boundary surface 35. The third surface 51c of the end portion 51 is also a flat surface inclined outward with respect to the direction A1. The inclination angle of the third surface 51c with respect to the direction A1 is gentler than the inclination angle of the second surface 51b with respect to the direction A1. Accordingly, the thickness of the end portion 51 in the direction A2 parallel to the main surface 31 gradually increases toward the tip of the end portion 51.

In manufacturing the damascene wiring structure 100 of the first modification, for example, the groove 33 is formed by reactive ion etching using a non-Bosch process and a Bosch process. Accordingly, when the groove 33 is formed, the boundary surface 35 is formed at the boundary part between the main surface 31 and the groove 33 in the substrate 30. The reliability can be improved by combining the non-Bosch process and the Bosch process.

According to the first modification, the reliability can be improved as in the above-described embodiment. Further, since the boundary surface 35 is provided at the boundary part between the main surface 31 and the groove 33 in the substrate 30, the inclined surface 43b can be easily formed. Also in the first modification, the interval B between the portions 33a of the groove 33 may be smaller than the width W of the groove 33. In the case of the first modification, the interval B is a distance between the inner surfaces 34 other than the boundary surface 35 in the plurality of portions 33a (in other words, a distance between portions of the inner surfaces 34 extending along the direction A1 perpendicular to the main surface 31).

Figure 9:
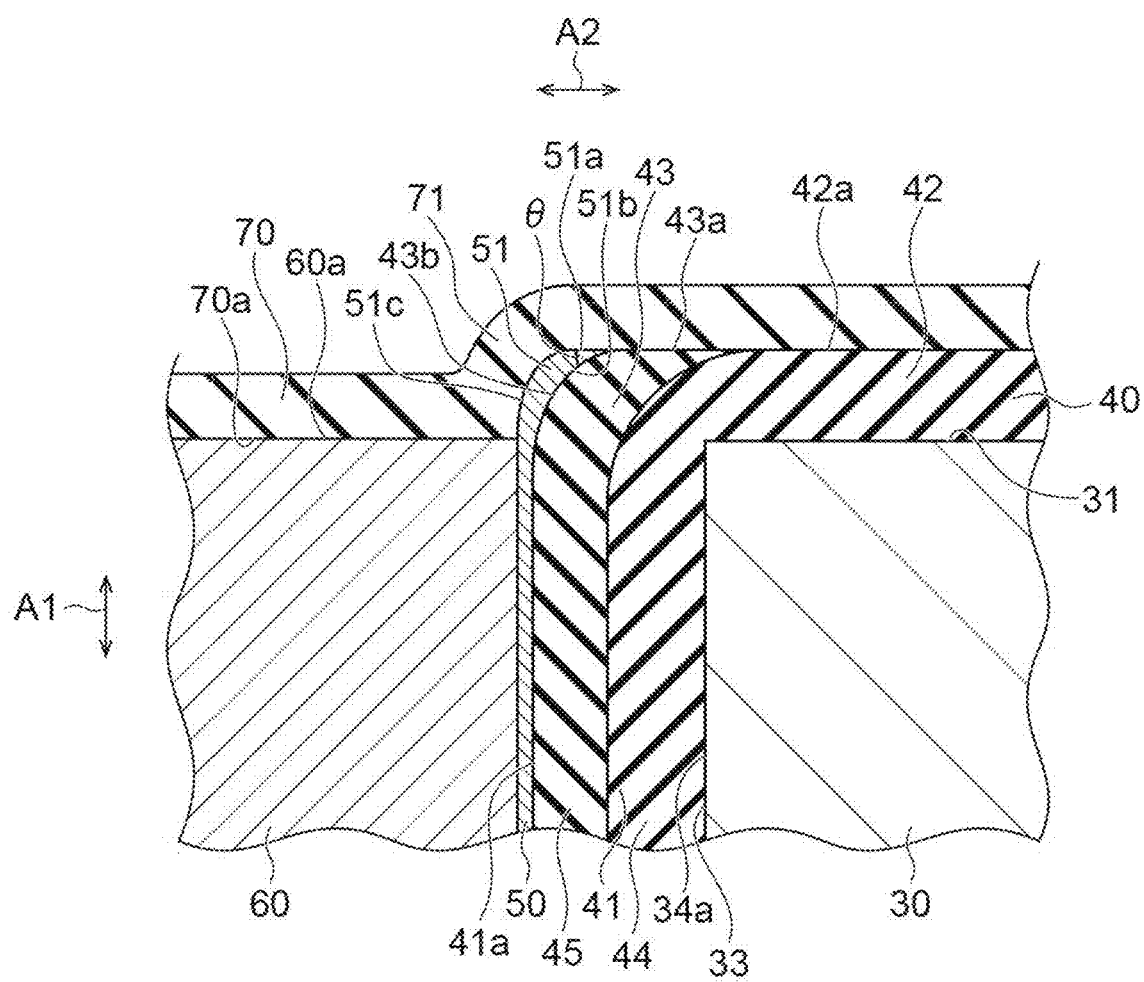
FIG. 9 is a cross-sectional view of a damascene wiring structure according to a second modification.

The damascene wiring structure 100 may be configured as in a second modification shown in FIG. 9. In the second modification, the surface 60a of the wiring portion 60 is located on the bottom surface 34b side of the groove 33 with respect to the surface 42a of the second portion 42 of the insulating layer 40. The third surface 51c of the end portion 51 of the metal layer 50 is covered by a boundary part 71 between a portion on the surface 60a and a portion on the surface 42a in the cap layer 70. The boundary part 71 extends along the third surface 51c and is inclined outward with respect to the direction A1 perpendicular to the main surface 31. In manufacturing the damascene wiring structure 100 of the second modification, for example, the amount of dishing of the wiring portion 60 (the amount of removal of the wiring portion 60) is increased by adjusting the slurry in the chemical mechanical polishing of the fourth step. Thus, the wiring portion 60 including the shape shown in FIG. 9 can be formed.

According to the second modification, the reliability can be improved as in the above embodiment. Further, the surface 60a is positioned on the bottom surface 34b side of the groove 33 with respect to the surface 42a. As a result, it is possible to further reduce the number of places where stress is likely to concentrate. Further, since the third surface 51c of the end portion 51 is covered by the boundary part 71, the contact area between the end portion 51 of the metal layer 50 and the cap layer 70 can be further increased, and the stress acting on the cap layer 70 from the metal layer 50 can be further suitably dispersed.

The damascene wiring structure 100 may be configured as in a third modification shown in FIG. 10(a). In the third modification, as in the second modification, the surface 60a of the wiring portion 60 is located on the bottom surface 34b side of the groove 33 with respect to the surface 42a of the second portion 42 of the insulating layer 40. The third surface 51c of the end portion 51 of the metal layer 50 is covered by the boundary part 71 of the cap layer 70. In the third modification, the thickness T3 of the cap layer 70 is larger than the distance H between the surface 60a and the surface 42a in the direction A1 perpendicular to the main surface 31. According to the third modification, the reliability can be improved as in the above embodiment. Further, since the thickness T1 of the cap layer 70 is larger than the distance H between the surface 60a and the surface 42a in the direction A1 perpendicular to the main surface 31, the strength of the cap layer 70 can be further increased.

The damascene wiring structure 100 may be configured as in a fourth modification shown in FIG. 10(b). In the fourth modification, as in the second modification, the surface 60a of the wiring portion 60 is located on the bottom surface 34b side of the groove 33 with respect to the surface 42a of the second portion 42 of the insulating layer 40. The third surface 51c of the end portion 51 of the metal layer 50 is covered by the boundary part 71 of the cap layer 70. In the fourth modification, the thickness T4 of the cap layer 70 is smaller than the distance H between the surface 60a and the surface 42a in the direction A1 perpendicular to the main surface 31. According to the fourth modification, the reliability can be improved as in the above embodiment. Further, since the thickness T1 of the cap layer 70 is smaller than the distance H between the surface 60a and the surface 42a in the direction A1 perpendicular to the main surface 31, the thickness of the wiring portion 60 in the direction A1 can be reduced, and as a result, the stress acting on the cap layer from the wiring portion 60 can be further reduced.

The shape and arrangement of the coils 21 and 22 are not limited to the example described above. For example, in the above embodiment, the coil 22 has only the portion extending in the direction parallel to the first axis X1 and the portion extending in the direction parallel to the second axis X2, but the coil 22 may have a portion extending in a direction intersecting the first axis X1 and the second axis X2 in plan view. The coil 22 may have a portion extending at an angle of 45 degrees with respect to the first axis X1 in plan view. The same applies to the coil 21. In the above embodiment, one of the coils 21 and 22 may be omitted. In the above embodiment, the second movable portion 4 may be regarded as a support that swingably supports the first movable portion 3. The second movable portion 4 and the second connection portions 7 and 8 may be omitted. In this case, the first movable portion 3 is swung only about the first axis X1.

The material and shape of each component are not limited to the examples described above. The third surface 51c of the end portion 51 of the metal layer 50 may extend along the second surface 51b. For example, the degree of inclination (inclination angle) of the third surface 51c may be the same as the degree of inclination (inclination angle) of the second surface 51b. The third surface 51c and the second surface 51b may extend parallel to each other. The second portion 42 may be constituted by the first layer 44 and the second layer 45. In this case, it is possible to further reduce the number of places on which stress is likely to concentrate. When the cap layer 70 is formed of the same material as that of the second layer 45 of the insulating layer 40, the area of a portion where the same materials are joined to each other is increased, so that adhesion can be increased. The insulating layer 40 may be formed of a single layer. The insulating layer 40 may be formed of a single layer made of an oxide film, for example. In this case, the cap layer 70 may be formed of an oxide film. When viewed from the extending direction of the wiring portion 60, the first surface 51a and the second surface 51b may be connected to each other such that their curvatures are continuous. The damascene wiring structure 100 may be applied to a configuration other than the actuator device.

REFERENCE SIGNS LIST

1: mirror device (actuator device), 2: support, 3: first movable part, 4: second movable part (support), 9: magnetic field generation part, 21, 22: coil, 30: substrate, 31: main surface, 33: groove 34: inner surface, 34b: bottom surface, 35: boundary surface, 40: insulating layer, 41: first portion, 42: second portion, 42a: surface (second contact surface), 43: boundary part, 43a: surface, 43b: inclined surface, 44: first layer, 45: second layer, 50: metal layer, 51: end portion, 51a: first surface, 51b: second surface, 51c: third surface, 60: wiring portion, 60a: surface (first contact surface), 61: part of wiring portion, 70: cap layer, 81a: surface (opposite surface), 100: damascene wiring structure

The invention claimed is:

1. A damascene wiring structure comprising:
   a base including a main surface provided with a groove;
   an insulating layer including a first portion provided on an inner surface of the groove and a second portion formed integrally with the first portion and provided on the main surface;
   a metal layer provided on the first portion of the insulating layer;
   a wiring portion embedded in the groove and joined to the metal layer; and
   a cap layer provided to cover the second portion of the insulating layer, an end portion of the metal layer, and the wiring portion,
   wherein a surface of a boundary part between the first portion and the second portion in the insulating layer on a side opposite to the base includes an inclined surface inclined with respect to a direction perpendicular to the main surface when viewed from an extending direction of the wiring portion, and
   the end portion of the metal layer enters between the cap layer and the inclined surface, and in the end portion, a first surface along the cap layer and a second surface along the inclined surface form an acute angle.

2. The damascene wiring structure according to claim 1, wherein a thickness of the cap layer is greater than a thickness of the insulating layer.

3. The damascene wiring structure according to claim 1, wherein a portion of the cap layer in contact with the first surface of the end portion of the metal layer and a portion of the insulating layer in contact with the second surface of the end portion of the metal layer are made of the same material.

4. The damascene wiring structure according to claim 1, wherein the insulating layer includes a first layer made of an oxide film and a second layer made of a nitride film and provided on the first layer.

5. The damascene wiring structure according to claim 1, wherein a boundary surface inclined with respect to a direction perpendicular to the main surface is provided at a boundary part between the main surface and the groove in the base when viewed from the extending direction.

6. The damascene wiring structure according to claim 1, wherein the inclined surface is convexly curved.

7. The damascene wiring structure according to claim 1, wherein a third surface opposite to the second surface in the end portion of the metal layer is inclined with respect to a direction perpendicular to the main surface when viewed from the extending direction, and
   a part of the wiring portion enters between the cap layer and the third surface.

8. The damascene wiring structure according to claim 1, wherein a thickness of the end portion of the metal layer in a direction parallel to the main surface is larger than a thickness of a portion of the metal layer other than the end portion.

9. The damascene wiring structure according to claim 1, wherein a thickness of the end portion of the metal layer in a direction parallel to the main surface gradually increases toward a tip of the end portion.

10. The damascene wiring structure according to claim 1, wherein a first contact surface of the wiring portion in contact with the cap layer is located on a bottom side of the groove with respect to a second contact surface of the insulating layer in contact with the cap layer.

11. The damascene wiring structure according to claim 10, wherein a thickness of the cap layer is larger than a distance between the first contact surface and the second contact surface in a direction perpendicular to the main surface.

12. The damascene wiring structure according to claim 10, wherein a thickness of the cap layer is smaller than a distance between the first contact surface and the second contact surface in a direction perpendicular to the main surface.

13. The damascene wiring structure according to claim 1, wherein the groove extends in a spiral shape when viewed from a direction perpendicular to the main surface.

14. The damascene wiring structure according to claim 13, wherein an interval between adjacent portions of the groove is smaller than a width of the groove.

15. The damascene wiring structure according to claim 1, wherein a width of the groove is smaller than a depth of the groove.

16. The damascene wiring structure according to claim 1, wherein the base includes an opposite surface opposite to the main surface, and
   a distance between a bottom portion of the groove and the opposite surface in a direction perpendicular to the main surface is larger than a depth of the groove.

17. An actuator device comprising the damascene wiring structure according to claim 1, the actuator device comprising:
- a support;
- a movable portion swingably supported at the support;
- a coil including the damascene wiring structure and provided in at least one of the support and the movable portion;
- a magnetic field generation unit that generates a magnetic field acting on the coil.

18. A method of manufacturing a damascene wiring structure, comprising:
- a first step of forming an insulating layer on a base including a main surface provided with a groove, the insulating layer including a first portion provided on an inner surface of the groove and a second portion formed integrally with the first portion and provided on the main surface;
- a second step of forming a metal layer on the first portion and the second portion of the insulating layer after the first step;
- a third step of forming a wiring portion on the metal layer so as to be embedded in the groove and joined to the metal layer after the second step;
- a fourth step of removing and planarizing the metal layer and the wiring portion on the second portion by chemical mechanical polishing so that the second portion of the insulating layer is exposed after the third step; and
- a fifth step of forming a cap layer so as to cover the second portion of the insulating layer, an end portion of the metal layer, and the wiring portion after the fourth step,
- wherein in the first step, the insulating layer is formed such that a surface of a boundary part between the first portion and the second portion in the insulating layer on a side opposite to the base includes an inclined surface inclined with respect to a direction perpendicular to the main surface when viewed from an extending direction of the wiring portion.

19. The method of manufacturing a damascene wiring structure according to claim 18, wherein in the second step, the metal layer is formed by sputtering.

* * * * *